(12) United States Patent
Lu et al.

(10) Patent No.: US 12,680,594 B2
(45) Date of Patent: Jul. 14, 2026

(54) ULTRA-STABLE MULTI-DIRECTIONAL LOW-FREQUENCY ACTUATOR

(71) Applicant: Shanghai University, Shanghai (CN)

(72) Inventors: Zeqi Lu, Shanghai (CN); Rongbiao Hao, Shanghai (CN); Yuansuo Zhang, Shanghai (CN); Zhongpu Yang, Shanghai (CN); Long Zhao, Shanghai (CN); Hu Ding, Shanghai (CN); Liqun Chen, Shanghai (CN)

(73) Assignee: Shanghai University, Shanghai (CN)

( * ) Notice: Subject to any disclaimer, the term of this patent is extended or adjusted under 35 U.S.C. 154(b) by 60 days.

(21) Appl. No.: 18/934,648

(22) Filed: Nov. 1, 2024

(65) Prior Publication Data

US 2025/0172192 A1     May 29, 2025

(30) Foreign Application Priority Data

Nov. 3, 2023   (CN) .......................... 202311459221.0

(51) Int. Cl.
| | |
|---|---|
| *F16F 7/00* | (2006.01) |
| *F16F 15/00* | (2006.01) |
| *F16F 15/02* | (2006.01) |
| *G03F 7/00* | (2006.01) |

(52) U.S. Cl.
CPC .......... *F16F 15/002* (2013.01); *F16F 15/007* (2013.01); *F16F 15/022* (2013.01); *G03F 7/709* (2013.01)

(58) Field of Classification Search
CPC ...... F16F 15/002; F16F 15/007; F16F 15/022; G03F 7/709
See application file for complete search history.

(56) References Cited

U.S. PATENT DOCUMENTS

| | | | | |
|---|---|---|---|---|
| 5,374,129 A * | 12/1994 | Vohr | ..................... | F01D 25/164 384/118 |
| 8,899,393 B2 * | 12/2014 | Kraner | ................. | G05B 19/404 188/380 |
| 12,535,119 B2 * | 1/2026 | Wang | .................... | F16F 15/007 |
| 2012/0261869 A1 * | 10/2012 | Rodenbeck | ............ | B60G 17/08 267/219 |
| 2024/0044388 A1 * | 2/2024 | Blad | ....................... | F16F 1/027 |

* cited by examiner

*Primary Examiner* — Amy J. Sterling
(74) *Attorney, Agent, or Firm* — Thomas Horstemeyer, LLP

(57) ABSTRACT
Provided is an ultra-stable multi-directional low-frequency actuator, including a baseplate, a bearing plate, a connecting mechanism, and two executing mechanisms symmetrically arranged on the baseplate about a Y axis. Both ends of a lower part of the support leg are connected with the baseplate through one high-static low-dynamic spring damper and one vertical executer arranged in parallel, respectively. Both ends of an upper part of the support leg are provided with one sensing component, respectively. A horizontal executer and an elastic component are arranged in parallel between each of both sides of a lateral support seat and a first groove, and sensing components corresponding to the horizontal executers one by one are arranged at an inner side of the support leg. The connecting mechanism is configured to connect two support legs, both ends of the bearing plate are mounted at the upper parts of the two support leg.

10 Claims, 6 Drawing Sheets

ULTRA-STABLE MULTI-DIRECTIONAL LOW-FREQUENCY ACTUATOR

CROSS-REFERENCE TO RELATED APPLICATION

This patent application claims the benefit and priority of Chinese Patent Application No. 202311459221.0 filed with the China National Intellectual Property Administration on Nov. 3, 2023, the disclosure of which is incorporated by reference herein in its entirety as part of the present application.

TECHNICAL FIELD

The present disclosure relates to the field of vibration isolation, and in particular to an ultra-stable multi-directional low-frequency actuator.

BACKGROUND

With the rapid development of large-scale integrated circuits, ultra-micro imaging is the key technology of integrated circuit manufacturing. The performance of a lithography machine which serves as key equipment directly affects the imaging accuracy. It is crucial to ensure the vibration level of the lithography machine, so it is urgent for precision photolithography to achieve efficient and stable ultra-low-frequency vibration isolation. At present, technologies of the passive vibration isolation and active vibration isolation are widely used to achieve low-frequency vibration isolation. On the one hand, it is difficult for the technology of the passive vibration isolation to achieve ultra-low-frequency vibration isolation due to poor stability; on the other hand, it is difficult for the technology of the active vibration isolation to achieve ultra-low frequency vibration isolation due to the distortion of an extremely-low-frequency active actuator. In contrast, the ultra-stable multi-directional low-frequency actuator has the advantages of stability and ultra-low-frequency actuation as well as considerable economy, and thus becomes the first choice to achieve a control for the ultra-low-frequency vibration isolation.

However, like other vibration control technologies, the ultra-stable multi-directional low-frequency actuation technology also has disadvantages which are difficult to overcome. For example, the inherent frequency of the system should be reduced to improve the ultra-low-frequency vibration control efficiency of the system, that is, the actuator is required to have low enough stiffness. However, to ensure that the actuator has a certain bearing capacity and stability, the actuator is also required to have large static stiffness. Therefore, the traditional actuation technology always has the problem of trade-off between dynamic stiffness and static deformation. In addition, in order to improve the robustness of the actuator, various characteristics of the actuator should be dynamically adjustable, and the reliability and stability of the system also need to be guaranteed. However, the traditional actuator technology has the problem of actuator distortion.

SUMMARY

In order to solve the technical problem above, an ultra-stable multi-directional low-frequency actuator is provided in the present disclosure, which can guarantee the stability, reliability and robustness of the system while achieving six-degree-of-freedom ultra-low-frequency actuation.

To achieve the objective above, the present disclosure provides the following technical solutions:

An ultra-stable multi-directional low-frequency actuator is provided in the present disclosure, including a baseplate, a bearing plate, a connecting mechanism, and two executing mechanisms symmetrically arranged on the baseplate with respect to a Y axis. Each of the executing mechanisms includes a support leg, a lateral support seat, two high-static low-dynamic spring dampers, two vertical executers, two horizontal executers, two elastic components, and four sensing components. Both ends of a lower part of the support leg are connected with the baseplate through one high-static low-dynamic spring damper and one vertical executer which are arranged in parallel, respectively, and both ends of an upper part of the support leg are provided with one sensing component, respectively. The lateral support seat is arranged on the baseplate, a first groove is formed in a middle part of an outer side of the support leg, one horizontal executer and one elastic component are arranged in parallel between each of both sides of the lateral support seat and the first groove, and both ends of each of horizontal executers are connected with the lateral support seat and the support leg, respectively. The sensing components corresponding to the horizontal executers one by one are arranged at an inner side of the support leg; the two horizontal executers located on a same lateral support seat are symmetrically arranged with respect to an X axis, and axial directions of the two horizontal executers located on the same lateral support seat are perpendicular to each other. The connecting mechanism are configured to connect two support legs, both ends of the bearing plate are mounted at upper parts of the two support legs, respectively, and the vertical executers and the horizontal executers are configured to drive the bearing plate to perform six-degree-of-freedom actuation.

Alternatively, the connecting mechanism includes two connecting plates. Both ends of one connecting plate of the two connecting plates are connected with ends of the two supporting legs, respectively, and both ends of the other connecting plate of the two connecting plates are connected with the other ends of the two support legs, respectively.

Alternatively, two second grooves are formed in the inner side of the support leg, the first groove is located between the two second grooves, and one side, close to the first groove, of each of the two second grooves is provided with one of the sensing components.

Alternatively, the first groove is a first L-shaped groove, and the second groove is a second L-shaped groove.

Alternatively, the lateral support seat includes a bottom plate, and two side plates vertically arranged on the bottom plate. The bottom plate is arranged on the baseplate, and the two side plates are perpendicular to each other. The two side plates are parallel to two side surfaces of the first groove, respectively. One horizontal executer and one elastic component are arranged in parallel between each of the two side plates and one side surface of the two side surfaces of the first groove, and both ends of each of the horizontal executers are connected with one of the two side plates and the support leg, respectively.

Alternatively, the horizontal executer is a horizontal voice coil motor. A stator and a mover of the horizontal voice coil motor are connected with the lateral support seat and the support leg, respectively, or the stator and the mover of the horizontal voice coil motor are connected with the support leg and the lateral support seat, respectively. The vertical executer is a vertical voice coil motor. A stator and a mover of the vertical voice coil motor are connected with the baseplate and the support leg, respectively, or the stator and the mover of the vertical voice coil motor are connected to the support leg and the baseplate, respectively.

Alternatively, the horizontal executer is a horizontal piezoelectric executer, one end of the horizontal piezoelectric executer is fixed onto the lateral support seat, and the other end of the horizontal piezoelectric executer is connected with the outer side of the support leg through a first spherical hinge. The vertical executer is a vertical piezoelectric executer, one end of the vertical executer is fixed onto the baseplate, and the other end of the vertical executer is connected with the lower part of the support leg through a second spherical hinge.

Alternatively, the high-static low-dynamic spring damper includes a base, a pre-compressed member, a connecting bolt, and two locking bolts. The base is arranged on the baseplate, and two accommodating grooves are formed in the base. Both ends of a lower part of the pre-compressed member are inserted into the two accommodating grooves, respectively. The two locking bolts are mounted respectively on both sides of the base and configured to lock and fix the two ends of the lower part of the pre-compressed member onto the base. A middle part of the pre-compressed member is connected with the support leg through the connecting bolt. A surface of the pre-compressed member is provided with a damping layer.

Alternatively, the pre-compressed member is a shape memory alloy sheet. The shape memory alloy sheet includes a horizontal sheet, two first inclined sheets, and two second inclined sheets. The two first inclined sheets are symmetrically arranged on both sides of the horizontal sheet. A lower end of each of the two first inclined sheets is provided with one of the two second inclined sheets. The two second inclined sheets are mounted in the two accommodating grooves, respectively. Each of the two locking bolts is configured to lock and fix one of the two second inclined sheets onto the base, and the connecting bolt is configured to fix the horizontal sheet onto the lower part of the support leg.

Alternatively, the pre-compressed member is a spring steel sheet with an arc structure, and both ends of a lower part of the spring steel sheet are mounted in the two accommodating grooves, respectively. Each of the two locking bolts is configured to lock and fix one end of the lower part of the spring steel sheet onto the base. Each of the two connecting bolts is configured to fix a middle part of the spring steel sheet onto the lower part of the support leg.

Compared with the prior art, the present disclosure has the following technical effects:

According to an ultra-stable multi-directional low-frequency actuator, both ends of a lower part of the support leg are connected with the baseplate through one high-static low-dynamic spring damper and one vertical executer which are arranged in parallel, respectively, and both ends of an upper part of the support leg are provided with one sensing component, respectively. A horizontal executer and an elastic component are arranged in parallel between each of both sides of a lateral support seat and a first groove, and sensing components corresponding to the horizontal executers one by one are arranged at an inner side of the support leg. The vertical executers and the horizontal executers are configured to drive the bearing plate to perform six-degree-of-freedom actuation. The high-static low-dynamic spring damper is used to achieve the characteristics of low dynamic stiffness and high static stiffness, which not only solves the problem of the existing actuator in the ultra-low-frequency vibration control, but also can ensure sufficient stability. A closed-loop controlled nonlinear actuator provided in the present disclosure can achieve real-time control and adjustment of an actuating force, increase robustness while achieving intelligent vibration control, avoid actuator distortion, has good abatement effect on different vibration environments, and is simple in structure and easy to assemble and disassemble.

BRIEF DESCRIPTION OF THE DRAWINGS

To describe the technical solutions of the embodiments of the present disclosure or in the prior art more clearly, the following briefly introduces the accompanying drawings required for describing the embodiments. Apparently, the accompanying drawings in the following description show merely some embodiments of the present disclosure, and those of ordinary skill in the art may still derive other drawings from these accompanying drawings without creative efforts.

Figure 1:
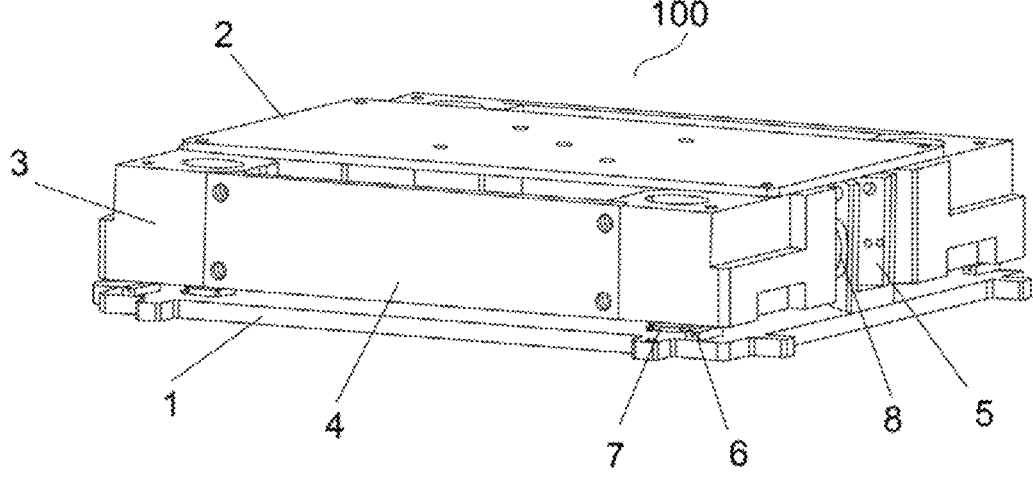
FIG. 1 is a first three-dimensional structural diagram of an ultra-stable multi-directional low-frequency actuator according to an embodiment of the present disclosure.
Figure 2:
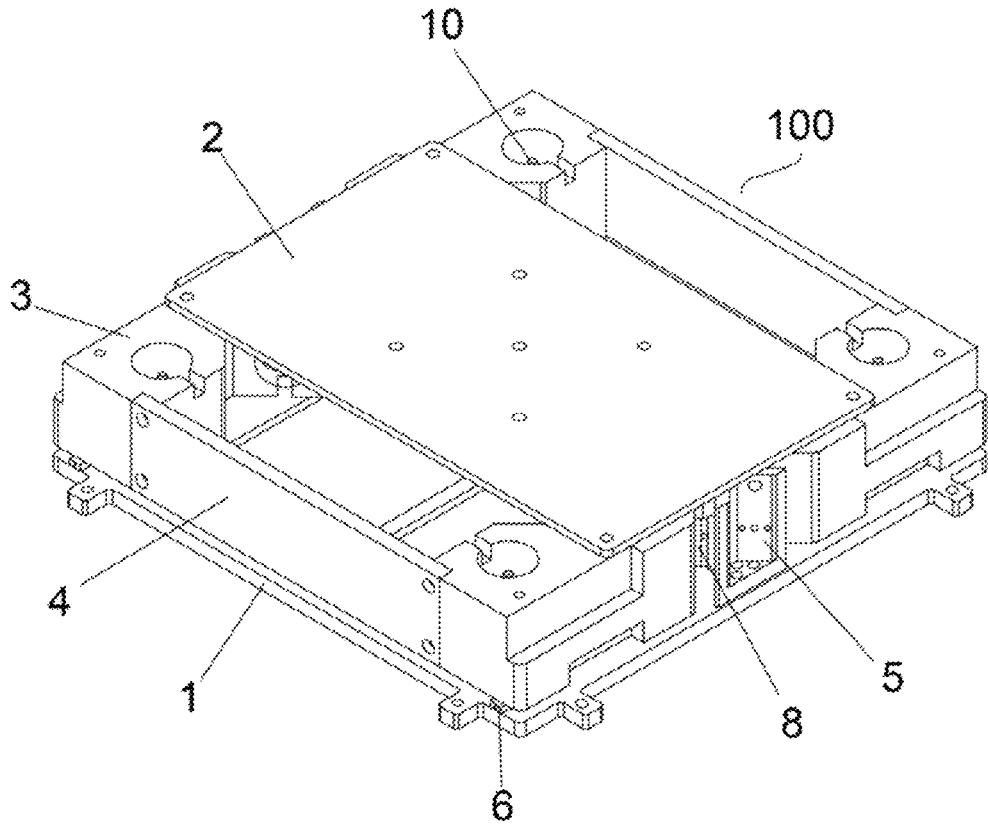
FIG. 2 is a second three-dimensional structural diagram of a multi-directional low-frequency ultra-stable actuator according to an embodiment of the present disclosure.
Figure 3:
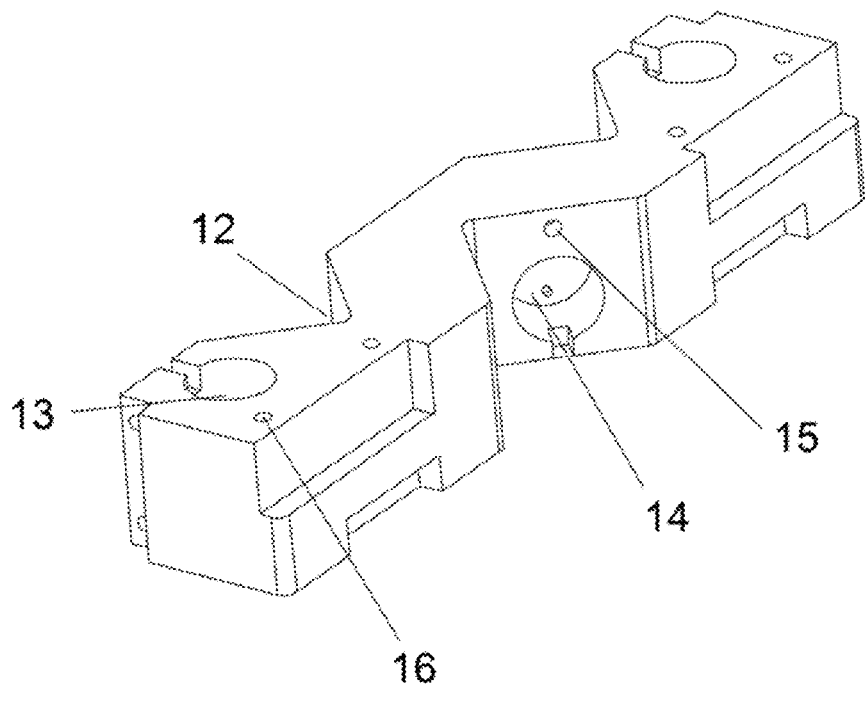
FIG. 3 is a first three-dimensional structural diagram of a support leg in an ultra-stable multi-directional low-frequency actuator according to an embodiment of the present disclosure.
Figure 4:
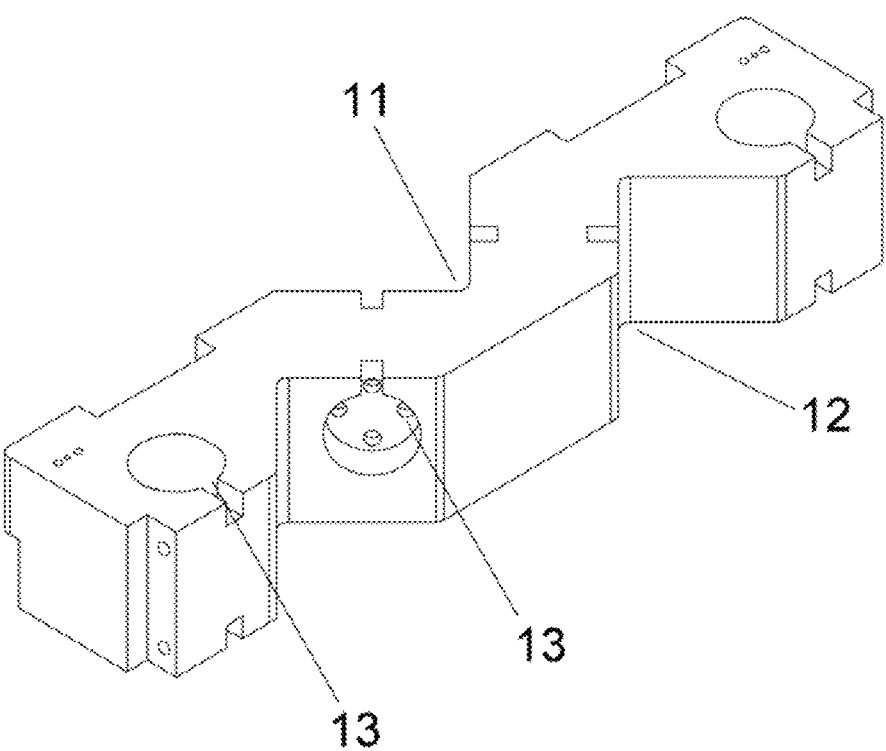
FIG. 4 is a second three-dimensional structural diagram of a support leg in an ultra-stable multi-directional low-frequency actuator according to an embodiment of the present disclosure.
Figure 5:
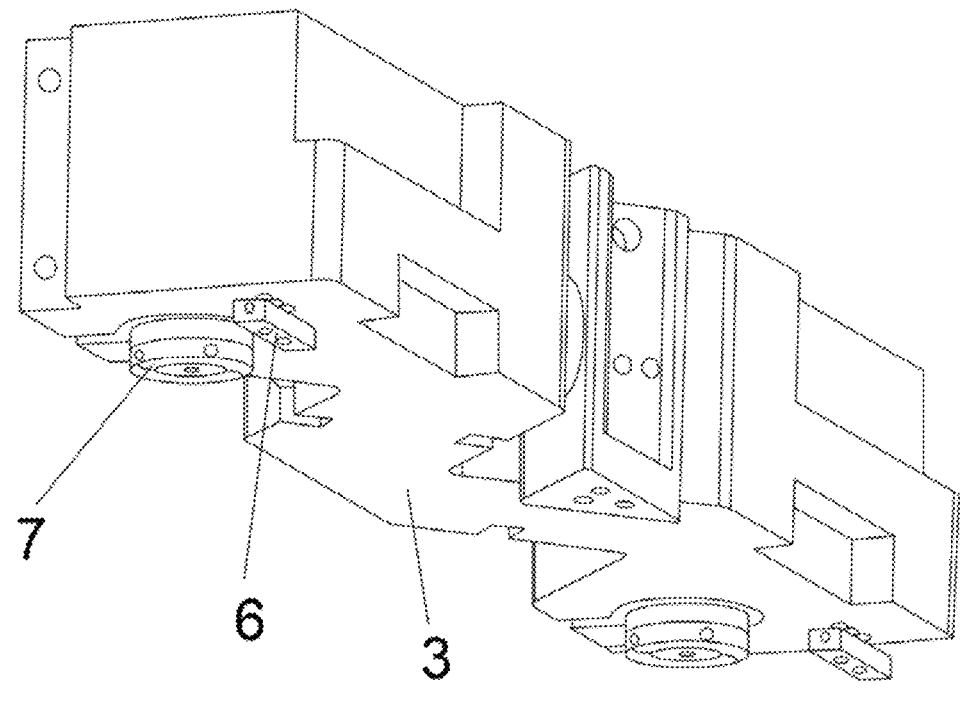
FIG. 5 is a schematic diagram of a mounting of a high-static low-dynamic spring damper and a vertical executer on a support leg in an ultra-stable multi-directional low-frequency actuator according to an embodiment of the present disclosure.
Figure 6:
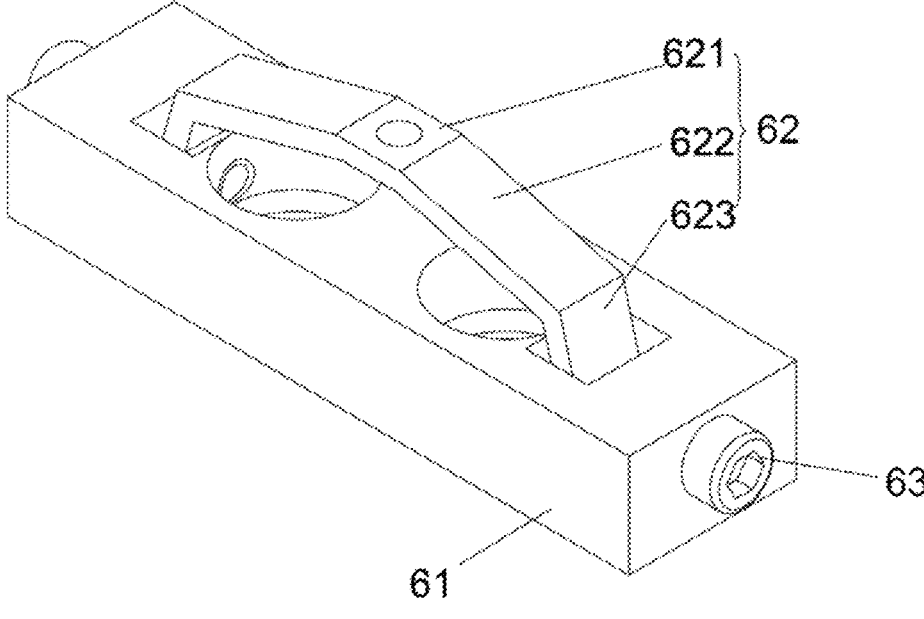
FIG. 6 is a structural diagram of a high-static low-dynamic spring damper in an ultra-stable multi-directional low-frequency actuator according to an embodiment of the present disclosure.
Figure 7:
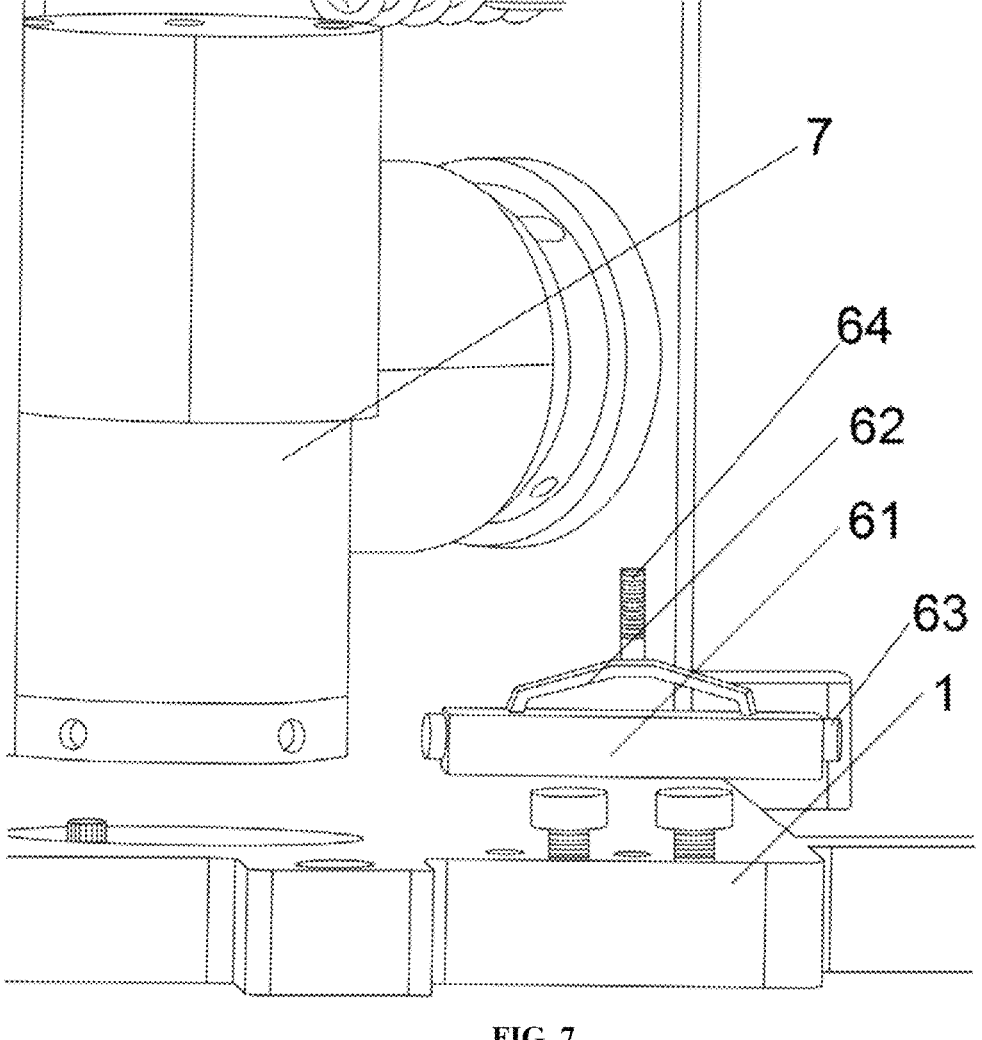
FIG. 7 is an exploded view of a mounting of a high-static low-dynamic spring damper and a vertical executer in an ultra-stable multi-directional low-frequency actuator according to an embodiment of the present disclosure.
Figure 8:
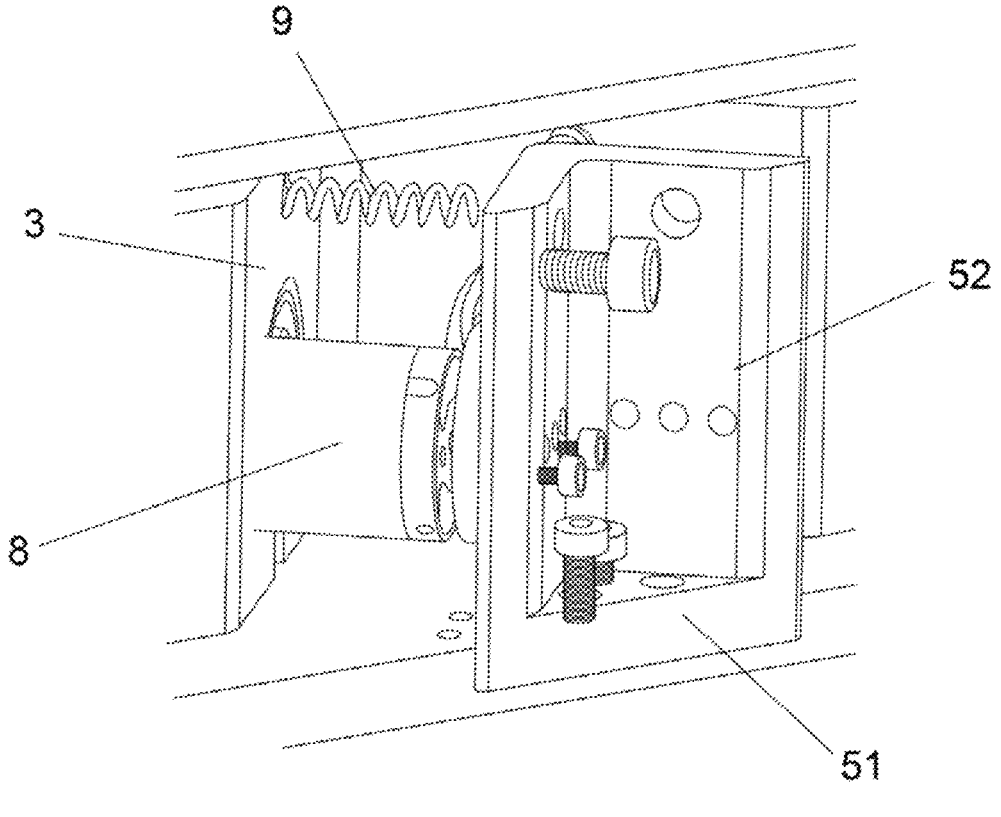
FIG. 8 is a schematic diagram of the mounting of an elastic component and a horizontal executer in an ultra-stable multi-directional low-frequency actuator according to an embodiment of the present disclosure.

The description of the reference numerals in the drawings: 100—ultra-stable multi-directional low-frequency actuator; 1—baseplate; 2—bearing plate; 3—support leg; 4—connecting plate; 5—lateral support seat; 51—bottom plate; 52—side plate; 6—high-static low-dynamic spring damper; 61—base; 62—shape memory alloy sheet; 621—horizontal sheet; 622—first inclined sheet; 623—second inclined sheet; 63—locking bolt; 64—connecting bolt; 7—vertical executer; 71—first vertical voice coil motor; 72—second vertical voice coil motor; 73—third vertical voice coil motor; 74—fourth vertical voice coil motor; 8—horizontal executer; 81—first horizontal voice coil motor; 82—second horizontal voice coil motor; 83—third horizontal voice coil motor; 84—fourth horizontal voice coil motor; 9—elastic component; 10—sensing component; 11—first groove; 12—second groove; 13—first mounting groove; 14—second mounting groove; 15—reserved hole; 16—lug hole.

DETAILED DESCRIPTION OF THE EMBODIMENTS

The following clearly and completely describes the technical solutions in the embodiments of the present disclosure with reference to the accompanying drawings in the embodiments of the present disclosure. Apparently, the described embodiments are merely a part rather than all of the embodiments of the present disclosure. All other embodiments obtained by those of ordinary skill in the art based on the embodiments of the present disclosure without creative efforts shall fall within the protection scope of the present disclosure.

An objective of the present disclosure is to provide an ultra-stable multi-directional low-frequency actuator, which can guarantee the stability, reliability and robustness of the system while achieving six-degree-of-freedom ultra-low-frequency actuation.

In order to make the above-mentioned objectives, features and advantages of the present disclosure more clearly, the present disclosure is further described in detail below with reference to the accompanying drawings and specific embodiments.

As shown in FIG. 1 to FIG. 9, an ultra-stable multi-directional low-frequency actuator 100 is provided in the embodiment, including a baseplate 1, a bearing plate 2, a connecting mechanism, and two executing mechanisms symmetrically arranged on the baseplate 1 with respect to a Y axis. Each executing mechanism includes a support leg 3, a lateral support seat 5, two high-static low-dynamic spring dampers 6, two vertical executers 7, two horizontal executers 8, two elastic components 9, and four sensing components 10. Both ends of a lower part of the support leg 3 are connected with the baseplate 1 through one high-static low-dynamic spring damper 6 and one vertical executer 7 arranged in parallel, respectively. Both ends of the high-static low-dynamic spring damper 6 are connected with the baseplate 1 and the support leg 3, respectively, and both ends of the vertical executer 7 are connected with the baseplate 1 and the support leg 3, respectively. Both ends of an upper part of the support leg 3 are provided with one sensing component 10, respectively. The lateral support seat 5 is arranged on the baseplate 1, and a first groove 11 is formed in a middle part of an outer side of the support leg 3. One horizontal executer 8 and one elastic component 9 are both arranged in parallel between each of both sides of the lateral support seat 5 and the first groove 11, and both ends of each of the horizontal executer 8 are connected with the lateral support seat 5 and the support leg 3, respectively. In this embodiment, one end of the elastic component 9 can be detachably mounted on the support leg 3, and the other end of the elastic component 9 is abutted against the lateral support seat 5. The sensing components 10 corresponding to the horizontal executers 8 one by one are arranged on the inner side of the support leg 3. The two horizontal executers 8 located on the same lateral support seat 5 are arranged symmetrically with respect to an X axis, and axial directions of the two horizontal executers 8 located on the same lateral support seat 5 are perpendicular to each other. Similarly, the two elastic components 9 abutted against the same lateral support seat 5 are arranged symmetrically with respect to the X axis, and the axial directions of the two elastic components 9 abutted against the same lateral support seat 5 are perpendicular to each other. The connecting mechanism is configured to connect two support legs 3. Both ends of the bearing plate 2 are mounted at the upper parts of the two support legs 3, respectively. The vertical executer 7 and the horizontal executer 8 are configured to drive the bearing plate 2 to perform six-degree-of-freedom actuation. The sensing component 10 is configured to sense acceleration. In this embodiment, the sensing component 10 may be a sensor. In this embodiment, the ultra-stable multi-directional low-frequency actuator 100 further includes a digital display console. The sensing component 10, the vertical executer 7 and the horizontal executer 8 are all connected with the digital display console to provide a closed-loop intelligent control.

In this embodiment, the high-static low-dynamic spring damper 6 is configured to achieve the characteristics of low dynamic stiffness and high static stiffness, which not only solves the problem of the existing actuator in ultra-low-frequency vibration control, but also can ensure sufficient stability. In this embodiment, a closed-loop controlled non-linear actuator is provided, which can achieve real-time control and adjustment of an actuating force, increase robustness while achieving intelligent vibration control, avoid actuator distortion, and has good abatement effect on different vibration environments.

In this embodiment, the high-static low-dynamic spring damper 6 and the vertical executer 7 are arranged in parallel, the horizontal executer 8 and the elastic component 9 are arranged in parallel. An orthogonal split arrangement is used to achieve the six-degree-of-freedom actuation. The stability, reliability and robustness of the system are ensured while achieving the six-degree-of-freedom ultra-low-frequency vibration control. In addition, the actuator in this embodiment further has the advantages of low cost, small power consumption, and convenient installation.

In this specific embodiment, the connecting mechanism includes two connecting plates 4. Both ends of one connecting plate 4 are connected with ends of the two supporting legs 3, respectively, and both ends of the other connecting plate 4 are connected with the other ends of the two support legs 3, respectively. The two connecting plates 4 are configured to provide a support stiffness of the actuator.

In this embodiment, both ends of the connecting plate 4 are fixed onto the two support legs 3 through bolts, and both ends of the bearing plate 2 are fixed to the upper parts of the two support legs 3 through the bolt.

In this specific embodiment, two second grooves 12 are formed in an inner side of the support leg 3, the first groove 11 is located between the two second grooves 12, and one side, close to the first groove 11, of each second groove 12 is provided with one sensing component 10, such that each of the sensing components 10 is located on an exactly opposite surface of one of the horizontal executers 8.

In this specific embodiment, the first groove 11 is a first L-shaped groove, and two side surfaces of the first L-shaped groove are perpendicular to each other. The second groove 12 is a second L-shaped groove, and two side surfaces of the second L-shaped groove are perpendicular to each other. In this embodiment, a side surface of the second L-shaped groove is parallel to a side surface, adjacent to the side surface of the second L-shaped groove, of the first L-shaped groove.

The lateral support seat 5 includes a bottom plate 51, and two side plates 52 vertically arranged on the bottom plate 51. The bottom plate 51 is arranged on the baseplate 1. In this embodiment, the bottom plate 51 is fixed onto the baseplate 1 through the bolt, and the two side plates 52 are vertically arranged and perpendicular to each other, and the two side plates 52 are parallel to two side surfaces of the first groove 11, respectively. One horizontal executer 8 and one elastic component 9 are both arranged in parallel between each of the side plate 52 and one side surface of the first groove 11, and both ends of each of the horizontal executer 8 are connected with one side plate 52 and the support leg 3, respectively. In this embodiment, one end of the elastic component 9 can be detachably mounted on the support leg 3, and the other end of the elastic component 9 is abutted against the side plate 52.

In this embodiment, the elastic component 9 is a spring. Specifically, the elastic component 9 is a low-stiffness spiral spring.

In this specific embodiment, one side, close to the first groove 11, of the second groove 12 is provided with a first mounting groove 13 for mounting the sensing component 10, and both ends of the upper part of the support leg 13 are provided with a first mounting groove 13 for mounting the sensing component 10, respectively. The two side surfaces of the first groove 11 are both provided with a second mounting groove 14 for mounting the horizontal executer 8, the two side surfaces of the first groove 11 are both provided with a reserved hole 15. One end of the elastic component 9 is clamped into the reserved hole 15, and the other end of the elastic component 9 is abutted against the side plate 52. Both ends of the lower part of the support leg 3 are both provided with a third mounting groove for mounting the vertical executer 7.

Further, an upper surface of the support leg 3 is provided with a lug hole 16 for carrying and hoisting the ultra-stable multi-directional low-frequency actuator 100 in this embodiment.

In this specific embodiment, the horizontal executer 8 is a horizontal voice coil motor, a stator and a mover of the horizontal voice coil motor are connected with the lateral support seat 5 and the support leg 3, respectively, or the stator or the mover of the horizontal voice coil motor are connected to the support leg 3 and the lateral support seat 5, respectively. In this embodiment, the stator of the horizontal voice coil motor is fixed into the second mounting groove 14 through the bolt, and the mover of the horizontal voice coil motor is fixed to the side plate 52 through the bolt.

In this specific embodiment, the vertical executer 7 is a vertical voice coil motor, a stator and a mover of the vertical voice coil motor are connected with the baseplate 1 and the support leg 3, respectively, or the stator or the mover of the vertical voice coil motor are connected to the support leg 3 and the baseplate 1, respectively. In this embodiment, the stator of the vertical voice coil motor is fixed into the third mounting groove through the bolt, and the mover of the vertical voice coil motor is fixed to the baseplate 1 through the bolt.

In this embodiment, an X-axis direction and a Y-axis direction are two directions perpendicular to each other in a horizontal plane, and a Z-axis direction is perpendicular to a horizontal plane where the X-axis direction and the Y-axis direction are located.

Figure 9:
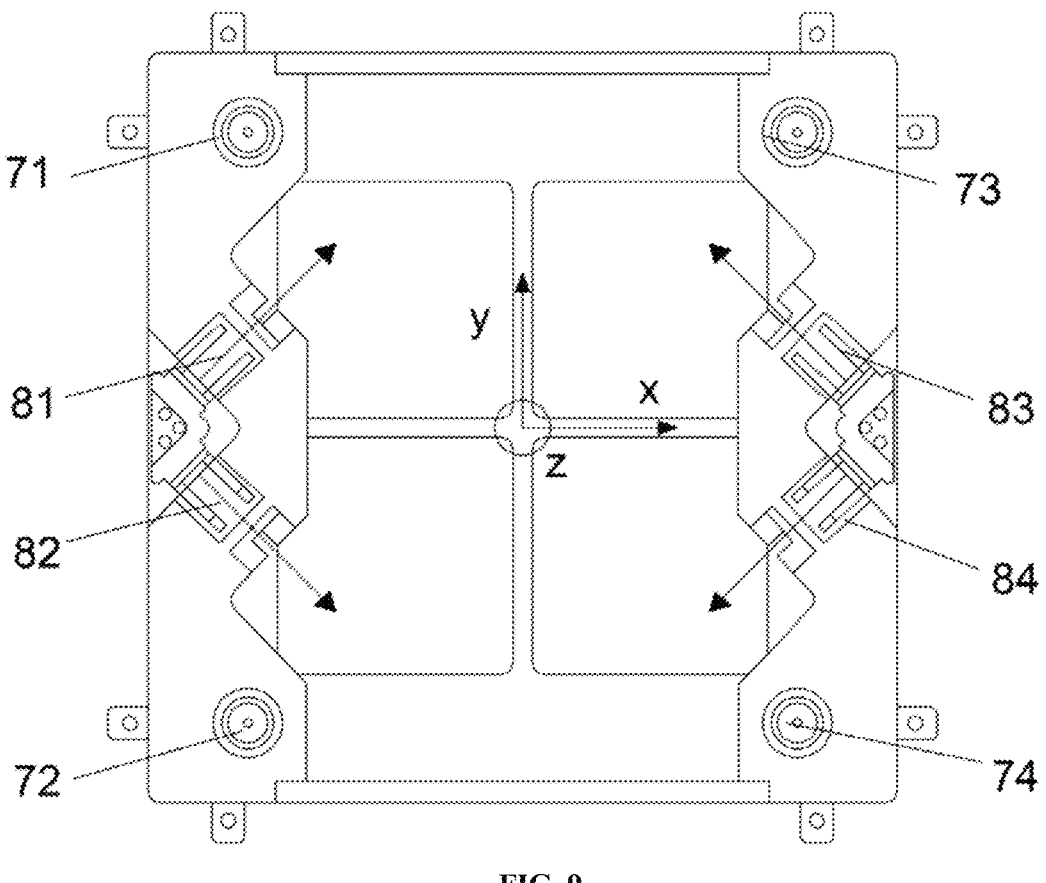
FIG. 9 is a working principle diagram of an ultra-stable multi-directional low-frequency actuator according to an embodiment of the present disclosure.

As shown in FIG. 9, four vertical voice coil motors and four horizontal voice coil motors are numbered. The support leg 3 on the left side is provided with a first vertical voice coil motor 71, a first horizontal voice coil motor 81, a second horizontal voice coil motor 82 and a second vertical voice coil motor 72 from top to bottom, and the support leg 3 on the right side is provided with a third vertical voice coil motor 73, a third horizontal voice coil motor 83, a fourth horizontal voice coil motor 84 and a fourth vertical voice coil motor 74 from top to bottom. X, Y and Z axes are orthogonal coordinate axes, and RX, RY and RZ are rotation directions around X, Y and Z axes, respectively, and a counterclockwise direction is set as a positive rotation direction. The positive directions of the first horizontal voice coil motor 81, the second horizontal voice coil motor 82, the third horizontal voice coil motor 83 and the fourth horizontal voice coil motor 84 are indicated by axial arrows, and the positive directions of the first vertical voice coil motor 71, the second vertical voice coil motor 72, the third vertical voice coil motor 73 and the fourth horizontal voice coil motor 84 are a positive direction of the Z axis. In the present disclosure, there is a gap between the stator and the mover of the vertical voice coil motor, and there is a gap between the stator and the mover of the horizontal voice coil motor, thus achieving rotational and translational motion.

In this specific embodiment, when the first horizontal voice coil motor 81 and the second horizontal voice coil motor 82 perform a movement in a positive direction, the third horizontal voice coil motor 83 and the fourth horizontal voice coil motor 84 perform a movement in a reverse direction relative to the positive direction, and other vertical voice coil motors do not move, the actuator actuates in a positive direction of the X axis. When the first horizontal voice coil motor 81 and the third horizontal voice coil motor 83 perform a movement in a positive direction, the second horizontal voice coil motor 82 and the fourth horizontal voice coil motor 84 perform a movement in a reverse direction relative to the positive direction, and other vertical voice coil motors do not move, the actuator actuates in a positive direction of the Y axis. When the first vertical voice coil motor 71, the second vertical voice coil motor 72, the third vertical voice coil motor 73 and the fourth vertical voice coil motor 74 perform a movement in a positive direction, and other horizontal voice coil motors do not move, the actuator actuates in a positive direction of the Z axis. When the second horizontal voice coil motor 82 and the third horizontal voice coil motor 83 perform a movement in a positive direction, the first horizontal voice coil motor 81 and the fourth horizontal voice coil motor 84 perform a movement in a reverse direction relative to the positive direction, and other vertical voice coil motors do not move, the actuator actuates in the RZ direction. When the first vertical voice coil motor 71 and the third vertical voice coil motor 73 perform a movement in a positive direction, the second vertical voice coil motor 72 and the fourth vertical voice coil motor 74 perform a movement in a reverse direction relative to the positive direction, and other horizontal voice coil motors do not move, the actuator actuates in the RX direction. When the first vertical voice coil motor 71 and the second vertical voice coil motor 72 perform a movement in a positive direction, the third vertical voice coil motor 73 and the fourth vertical voice coil motor 74 perform a movement in a reverse direction relative to the positive direction, and other horizontal voice coil motors do not move, the actuator actuates in the RY direction. So far, the six-degree-of-freedom actuation of the ultra-stable multi-directional low-frequency actuator 100 in this embodiment is achieved.

In another specific embodiment, the horizontal executer 8 is a horizontal piezoelectric executer. One end of the horizontal piezoelectric executer is fixed onto the lateral support seat 5, and the other end of the horizontal piezoelectric executer is fixed to an outer side of the support leg 3 through a first spherical hinge. The vertical executer 7 is a vertical piezoelectric executer. One end of the vertical executer 7 is fixed onto the baseplate 1, and the other end of the vertical executer 7 is connected with the lower part of the support leg 3 through a second spherical hinge. By using the spherical hinge connection, the rotational and translation motion can be achieved, such that the ultra-stable multi-directional low-frequency actuator 100 in this embodiment can achieve six-degree-of-freedom actuation.

In this specific embodiment, the high-static low-dynamic spring damper 6 includes a base 61, a pre-compressed member, a connecting bolt 64, and two locking bolts 63. The base 61 is arranged on the baseplate 1. In this embodiment, the base 61 is fixed onto the baseplate 1 through the bolt, two accommodating grooves are formed in the base 61, and both ends of a lower part of the pre-compressed member are inserted into the two accommodating grooves, respectively. The two locking bolts 63 are mounted on both sides of the base 61, respectively, and used to lock and fix both ends of the lower part of the pre-compressed member onto the base 61. A middle part of the pre-compressed member is connected with the support leg 3 through the connecting bolt 64, and a surface of the pre-compressed member is provided with a damping layer.

In this embodiment, both ends of the base 61 are provided with a first threaded hole, each of the locking bolts 63 can be mounted in the first threaded hole and extended into one accommodating groove to abut against one end of the lower part of the pre-compressed member. A through hole for the connecting bolt 64 to pass through is formed in the middle part of the pre-compressed member, and the lower part of the support leg 3 is provided with a second threaded hole for mounting the connecting bolt 64.

In this specific embodiment, the pre-compressed member is a shape memory alloy sheet 62. The shape memory alloy sheet 62 includes a horizontal sheet 621, two first inclined sheets 622, and two second inclined sheets 623. The two first inclined sheets 622 are symmetrically arranged on both sides of the horizontal sheet 621. A lower end of each first inclined sheet 622 is provided with one second inclined sheet 623, and the two second inclined sheets 623 are respectively mounted in the two accommodating grooves. Each of the locking bolts 63 is used to lock and fix one of the second inclined sheets onto the base 61, and the connecting bolt 64 is used to fix the horizontal sheet 621 to the lower part of the support leg 3.

In this embodiment, the pre-compression interaction between the shape memory alloy sheet 62 and the base 61 is achieved through the locking bolt 63. During use, the high-static low-dynamic spring damper 6 is vertically compressed, which makes the shape memory alloy sheet 62 bent and deformed. When in a static situation, the high-static low-dynamic spring damper 6 is located near an equilibrium position, and in this case, the high-static low-dynamic spring damper 6 is with an extremely high static stiffness and can bear large mass. During operation, the shape memory alloy sheet 62 is buckled and unstable, and the resultant force exerted on both ends of the shape memory alloy sheet 62 changes from upward to downward, and it is specifically manifested in that the stiffness of the shape memory alloy sheet 62 becomes smaller, thus achieving low dynamic stiffness. Meanwhile, the shape memory alloy sheet 62 is coated with a damping layer. Due to internal friction characteristics of the material, a support reaction force of the shape memory alloy sheet 62 shows hysteresis, which is in line with a fractional order damping force model. The high-static low-dynamic spring damper 6 can be with high-static low-dynamic characteristics and fractional order damping characteristics by means of the shape memory alloy sheet 62 and the damping layer, thus achieving ultra-low-frequency vibration isolation.

In another specific embodiment, the pre-compressed member is a spring steel sheet with an arc structure. Both ends of a lower part of the spring steel sheet are mounted in the two accommodating grooves, respectively. Each of the locking bolt 63 is used to lock and fix one end of the lower part of the spring steel sheet onto the base 61, and the connecting bolt 64 is used to fix the middle part of the spring steel sheet onto the lower part of the support leg 3. Specifically, the flat spring steel sheet is bent into an arc structure, and both ends of the lower part of the spring steel sheet are inserted into two accommodating grooves, respectively, and then the spring steel sheet is fixed onto the base 61 through the locking bolts 63.

The specific process of use is as follows: equipment requiring high vibration characteristic is fixed onto an upper part of the bearing plate 2, and the high-static low-dynamic spring damper 6 is pre-deformed under the gravity of the bearing plate 2, such that the high-static low-dynamic spring damper 6 is located near an equilibrium position, showing fractional damping characteristics and near-zero vibration characteristics. The elastic component 9 is pre-compressed between the lateral support seat 5 and the support leg 3. As the two adjacent elastic components 9 are in a perpendicular relationship, the actuator is not subjected to pre-compressed force in a horizontal direction and can ensure stability. In this embodiment, the four vertical executers 7, the four high-static low-dynamic spring dampers 6, the four horizontal executers 8 and the four elastic components 9 are jointly used to achieve six-degree-of-freedom vibration control. Harmful vibration from the foundation, after being damped by the vertical executer 7, the high-static low-dynamic spring damper 6, the horizontal executer 8 and the elastic member 9 through the baseplate 1 and the lateral support seat 5, is transmitted to the bearing plate 2 and then to the working equipment. When a vibration environment changes, the sensing component 10, the vertical executer 7, the horizontal executer 8 and the digital display console work together to adjust an actuating force of the actuator in this embodiment in real time, thus achieving six-degree-of-freedom vibration control.

Specific examples are used herein for illustration of the principles and embodiments of the present disclosure. The description of the embodiments above is merely used to help to understand the method and its core principles of the present disclosure. In addition, those of ordinary skill in the art can make modifications in terms of specific implementations and scope of application in accordance with the teachings of the present disclosure. In conclusion, the content of this specification shall not be construed as a limitation to the present disclosure.

What is claimed is:

1. An ultra-stable multi-directional low-frequency actuator, comprising a baseplate, a bearing plate, a connecting mechanism, and two executing mechanisms symmetrically arranged on the baseplate with respect to a Y axis, wherein each of the executing mechanisms comprises a support leg, a lateral support seat, two high-static low-dynamic spring dampers, two vertical executers, two horizontal executers, two elastic components, and four sensing components; both ends of a lower part of the support leg are connected with the baseplate through one high-static low-dynamic spring damper and one vertical executer which are arranged in parallel, respectively, and both ends of an upper part of the support leg are provided with one sensing component, respectively; the lateral support seat is arranged on the baseplate, a first groove is formed in a middle part of an outer side of the support leg, one horizontal executer and one elastic component are arranged in parallel between each of both sides of the lateral support seat and the first groove, and both ends of each of the horizontal executers are connected with the lateral support seat and the support leg, respectively; the sensing components corresponding to the horizontal executers one by one are arranged at an inner side of the support leg; the two horizontal executers located on a same lateral support seat are symmetrically arranged with respect to an X axis, and axial directions of the two horizontal executers located on the same lateral support seat are perpendicular to each other; the connecting mechanism are configured to connect two support legs, both ends of the bearing plate are mounted at upper parts of the two support legs, respectively, and the vertical executers and the horizontal executers are configured to drive the bearing plate to perform six-degree-of-freedom actuation.

2. The ultra-stable multi-directional low-frequency actuator according to claim 1, wherein the connecting mechanism comprises two connecting plates, both ends of one connecting plate of the two connecting plates are connected with ends of the two supporting legs, respectively, and both ends of the other connecting plate of the two connecting plates are connected with the other ends of the two support legs, respectively.

3. The ultra-stable multi-directional low-frequency actuator according to claim 1, wherein two second grooves are formed in the inner side of the support leg, the first groove is located between the two second grooves, and one side, close to the first groove, of each of the two second grooves is provided with one of the sensing components.

4. The ultra-stable multi-directional low-frequency actuator according to claim 3, wherein the first groove is a first L-shaped groove, and the second groove is a second L-shaped groove.

5. The ultra-stable multi-directional low-frequency actuator according to claim 4, wherein the lateral support seat comprises a bottom plate and two side plates vertically arranged on the bottom plate; the bottom plate is arranged on the baseplate, and the two side plates are perpendicular to each other; the two side plates are parallel to two side surfaces of the first groove, respectively; one horizontal executer and one elastic component are arranged in parallel between each of the two side plates and one side surface of the two side surfaces of the first groove, and both ends of each of the horizontal executers are connected with one of the two side plates and the support leg, respectively.

6. The ultra-stable multi-directional low-frequency actuator according to claim 1, wherein the horizontal executer is a horizontal voice coil motor, a stator and a mover of the horizontal voice coil motor are connected with the lateral support seat and the support leg, respectively, or the stator and the mover of the horizontal voice coil motor are connected with the support leg and the lateral support seat, respectively; and the vertical executer is a vertical voice coil motor, a stator and a mover of the vertical voice coil motor are connected with the baseplate and the support leg, respectively, or the stator and the mover of the vertical voice coil motor are connected to the support leg and the baseplate, respectively.

7. The ultra-stable multi-directional low-frequency actuator according to claim 1, wherein the horizontal executer is a horizontal piezoelectric executer, one end of the horizontal piezoelectric executer is fixed onto the lateral support seat, and the other end of the horizontal piezoelectric executer is connected with the outer side of the support leg through a first spherical hinge; and the vertical executer is a vertical piezoelectric executer, one end of the vertical executer is fixed onto the baseplate, and the other end of the vertical executer is connected with the lower part of the support leg through a second spherical hinge.

8. The ultra-stable multi-directional low-frequency actuator according to claim 1, wherein the high-static low-dynamic spring damper comprises a base, a pre-compressed member, a connecting bolt, and two locking bolts; the base is arranged on the baseplate, and two accommodating grooves are formed in the base; both ends of a lower part of the pre-compressed member are inserted into the two accommodating grooves, respectively; the two locking bolts are mounted respectively on both sides of the base and configured to lock and fix the two ends of the lower part of the pre-compressed member onto the base; a middle part of the pre-compressed member is connected with the support leg through the connecting bolt; and a surface of the pre-compressed member is provided with a damping layer.

9. The ultra-stable multi-directional low-frequency actuator according to claim 8, wherein the pre-compressed member is a shape memory alloy sheet, and the shape memory alloy sheet comprises a horizontal sheet, two first inclined sheets, and two second inclined sheets; the two first inclined sheets are symmetrically arranged on both sides of the horizontal sheet; a lower end of each of the two first inclined sheets is provided with one of the two second inclined sheets; the two second inclined sheets are mounted in the two accommodating grooves, respectively; each of the two locking bolts is configured to lock and fix one of the two second inclined sheets onto the base; and the connecting bolt is configured to fix the horizontal sheet onto the lower part of the support leg.

10. The ultra-stable multi-directional low-frequency actuator according to claim 8, wherein the pre-compressed member is a spring steel sheet with an arc structure, and both ends of a lower part of the spring steel sheet are mounted in the two accommodating grooves, respectively; each of the two locking bolts is configured to lock and fix one end of the lower part of the spring steel sheet onto the base; and each of the two connecting bolts is configured to fix a middle part of the spring steel sheet onto the lower part of the support leg.

* * * * *